(12) United States Patent
Lee et al.

(10) Patent No.: US 6,800,928 B1
(45) Date of Patent: Oct. 5, 2004

(54) POROUS INTEGRATED CIRCUIT DIELECTRIC WITH DECREASED SURFACE POROSITY

(75) Inventors: Wei William Lee, Plano, TX (US); Richard Scott List, Beaverton, OR (US); Changming Jin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/087,234

(22) Filed: May 28, 1998

Related U.S. Application Data

(60) Provisional application No. 60/047,787, filed on May 28, 1997.

(51) Int. Cl.$^7$ ................................................ H01L 23/58

(52) U.S. Cl. ....................... 257/632; 257/638; 257/644; 257/650

(58) Field of Search ................................. 257/758, 760, 257/632, 644, 650, 638; 428/426

(56) References Cited

U.S. PATENT DOCUMENTS 5,561,318 A * 10/1996 Gnade et al. ................ 257/638
5,635,301 A *  6/1997 Kondo et al. ................ 428/426

* cited by examiner

Primary Examiner—Steven Loke
(74) Attorney, Agent, or Firm—Carlton H. Hoel; W. James Brady; Frederick J. Telecky, Jr.

(57) ABSTRACT

A surface treatment for porous silica to enhance adhesion of overlying layers. Treatments include surface group substitution, pore collapse, and gap filling layer (520) which invades open surface pores (514) of xerogel (510).

2 Claims, 18 Drawing Sheets

POROUS INTEGRATED CIRCUIT DIELECTRIC WITH DECREASED SURFACE POROSITY

RELATED APPLICATIONS

This application claims benefit of provisional Application No. 60/047,787, filed May 28, 1997.

The following patent applications disclose related subject matter: Ser. Nos. 09/087,457; 09/087,757; 09/087,462; and 09/087,458, all filed May 28, 1998. These applications have a common assignee with the present application.

GOVERNMENT LICENSE

The government may have certain rights in this patent application. NIST contract may cover TI-23611.

BACKGROUND OF THE INVENTION

The invention relates to electronic semiconductor devices, and, more particularly, to dielectric structures and fabrication methods for such structures.

The performance of high density integrated circuits is dominated by metal interconnect level RC time delays due to the resistivity of the metal lines and the capacitive coupling between adjacent lines. The capacitive cooling can be reduced by decreasing the relative permittivity (dielectric constant, k) of the dielectric (insulator) between adjacent lines.

Various dielectric materials have been suggested for use in silicon integrated circuits; namely, silicon dioxide (k about 4.0), fluorinated silicon dioxide (k about 3.0–4.0), organic materials such as polyimide, parylene, amorphous teflon (k about 1.9–3.9), and porous dielectrics such as silicon dioxide xerogels (k dependent upon pore size and typically 1.3–3.0). The porosity can be up to 99% by volume. See Smith et al, Preparation of Low-Density Xerogel at Ambient Pressure for Low k Dielectrics, 381 Mat.Res. .Soc.Symp.Proc. 261 (1995).

Thin film silica xerogels for integrated circuit dielectric use can be fabricated by the generic steps of (1) precursor preparation, (2) spin coating, (3) aging, (4) solvent exchange, and (5) drying. The acid-base sol-gel reactions could be as follows:

Hydrolyze an alkoxide in a solvent:

The solvent could be ethanol.
Then condense (gel) the hydrolyzed alkoxides:

The condensation would be controlled so that spin coating occurs after partial condensation to a convenient viscosity.

The solvent exchange replaces the original solvent residing within the pores of gel by low-surface-tension solvent to reduce the capillary pressure during drying and minimizing the collapse of the pores. U.S. Pat. No. 5,561,318 discloses variations of the process.

However, silica xerogels have not yet become manufacturable.

SUMMARY OF THE INVENTION

The present invention provides silica xerogel dielectric with enhanced surface adhesion by plasma activation, ion beam shell formation, or open surface pore filling deposition and/or with reducing atmosphere sintering to lower dielectric constant and incorporated as a multilevel integrated circuit dielectric.

This has the advantages of manufacturable interlevel dielectrics incorporating xerogel to lower dielectric constant.

BRIEF DESCRIPTION OF THE DRAWINGS

The drawings are heuristic for clarity.

DESCRIPTION OF THE PREFERRED EMBODIMENTS

Overview

The preferred embodiments enhance xerogel properties and use such enhanced xerogel as a major component of interlevel dielectrics in multilevel interconnect integrated circuits.

Hydrophobic xerogels typically provide poor surface adhesion due to the limited contact surface area of the open pores at the surface plus the hydrophobic surface nature. The xerogel top surface may be enhanced in three ways: (i) surface coating with a gap filling material which adheres with filling of the open surface pores, (ii) surface activation by exposure to a hydrogen plasma or other chemical agents, and (iii) by a continuous shell formation by top surface layer collapse through ion beam or plasma ion bombardment.

Further, dry the xerogel at high temperatures (e.g., 450° C.) in a reducing atmosphere (e.g., forming gas or hydrogen) to achieve low dielectric constant.

The integrated circuit multilevel dielectric of gapfill, damascene, and slot fill types all may incorporate xerogel.

Gapfill Etchback Preferred Embodiment

FIGS. 1a–g illustrate in cross sectional elevation views the steps of preferred embodiment fabrication methods for integrated circuit (e.g., CMOS or BiCMOS) as follows.

Figure 1A:
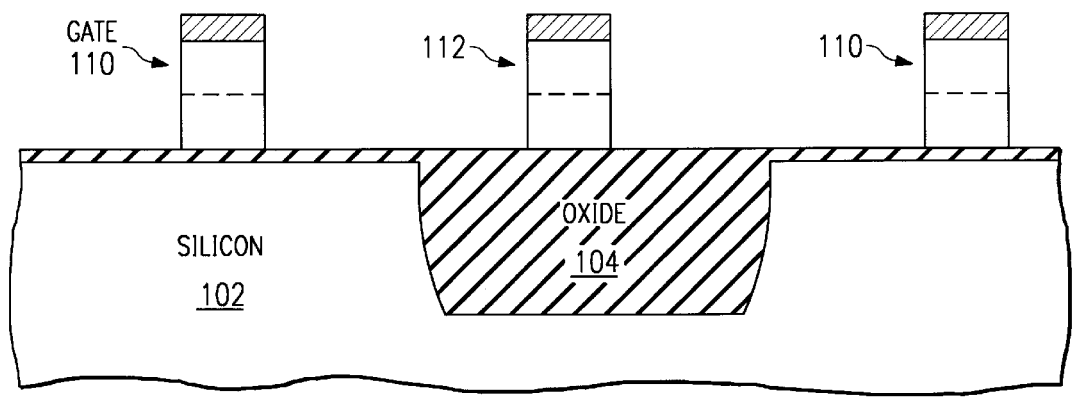
FIGS. 1a–g are cross sectional elevation views of a preferred embodiment integrated circuit fabrication method steps.
Figure 1B:
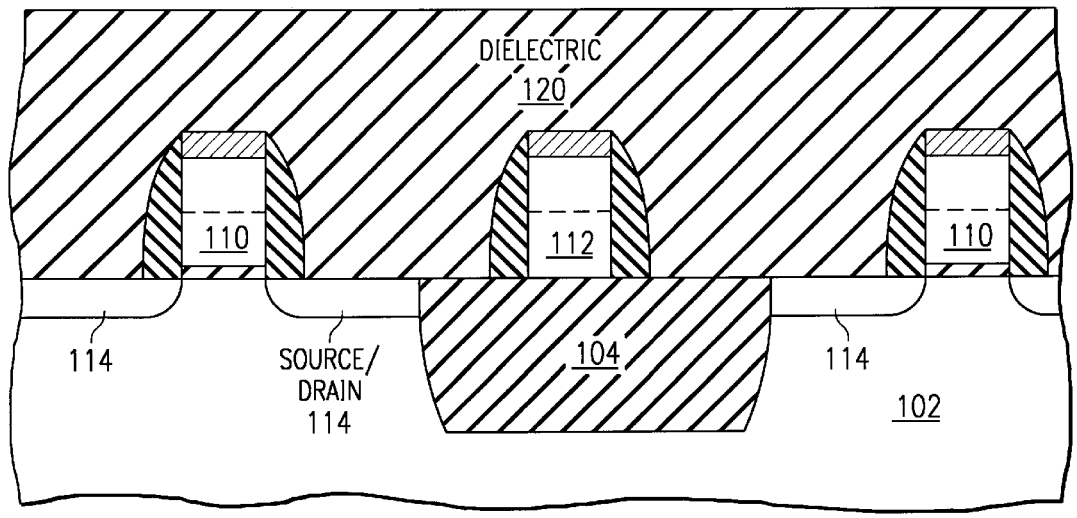

(1) Start with a silicon wafer (or silicon on insulator wafer) with shallow trench isolation and twin wells for CMOS devices (optionally, plus memory cell array wells and bipolar device buried layers). Perform threshold adjustment implants (which may differ for cell transistors and various peripheral transistors), and form gate dielectric. Deposit tungsten silicide coated polysilicon gate material and a silicon dioxide layer, then pattern the layers to form oxide-topped gates plus gate level interconnects. The gate material could also provide a polysilicon emitter for bipolar devices which would also require a prior base implant. See FIG. 1a which shows silicon substrate 102 with shallow trench isolation oxide 104 plus gates 110 and gate level interconnect 112. Gates 110 may be 200–300 nm high and 130–250 nm long (FIG. 1a is a cross section along the gate length, and gates typically have widths much greater than their lengths). An alternative would be formation of polysilicon gates followed by a self-aligned silicidation (after the source/drain and sidewall dielectric formation of the next step) to create a silicide on both the gate top and the source/drains.

(2). Perform lightly doped drain implants, and then form sidewall dielectric on the gates by deposition plus anisotropic etching. Introduce dopants to form sources and drains 114. Cover the gate level structure with a planarized dielectric layer 120 (such as BPSG or a stack of conformal and planarized layers with the top layer an undoped oxide such as a deposition from TEOS); see FIG. 1b.

(3) For a structure with an embedded memory cell array using one-transistor one-capacitor memory cells, the bitlines and cell capacitors may be formed next. For clarity such steps are not illustrated and attendant additional dielectrics deposited on dielectric 120 will just be considered part of dielectric 120.

(4) Photolithographically define and etch holes (contacts, vias) in planarized dielectric 120 down to selected source/drains 114 and locations on gate level interconnects 112 (and also to selected bitline locations for embedded memory). Blanket deposit (including filling vias) a metal stack such as 50 nm of Ti, 50 nm of TiN, 500 nm of W or Al (doped with Cu and Si), and 50 nm of TiN; the bottom Ti and TiN form a diffusion barrier and the top TiN forms an antireflective coating for lithography. Prior to the W or Al deposition the bottom Ti may be reacted with the source/drain to form a silicide to stabilize the metal-to-silicon contact. The Ti and TiN may be deposited by physical vapor deposition (PVD) or chemical vapor deposition (CVD) (e.g., TiCl4+NH3→TiN+HCl); the aluminum may be deposited by PCD and then forced into the vias under high pressure or by CVD; and W may be deposited by CVD. Alternatively, the vias may be filled with W by a CVD blanket deposition followed by an etchback to leave W only in the vias (W plug), and then blanket Ti, TiN, Al, and TiN depositions.

Figure 1C:
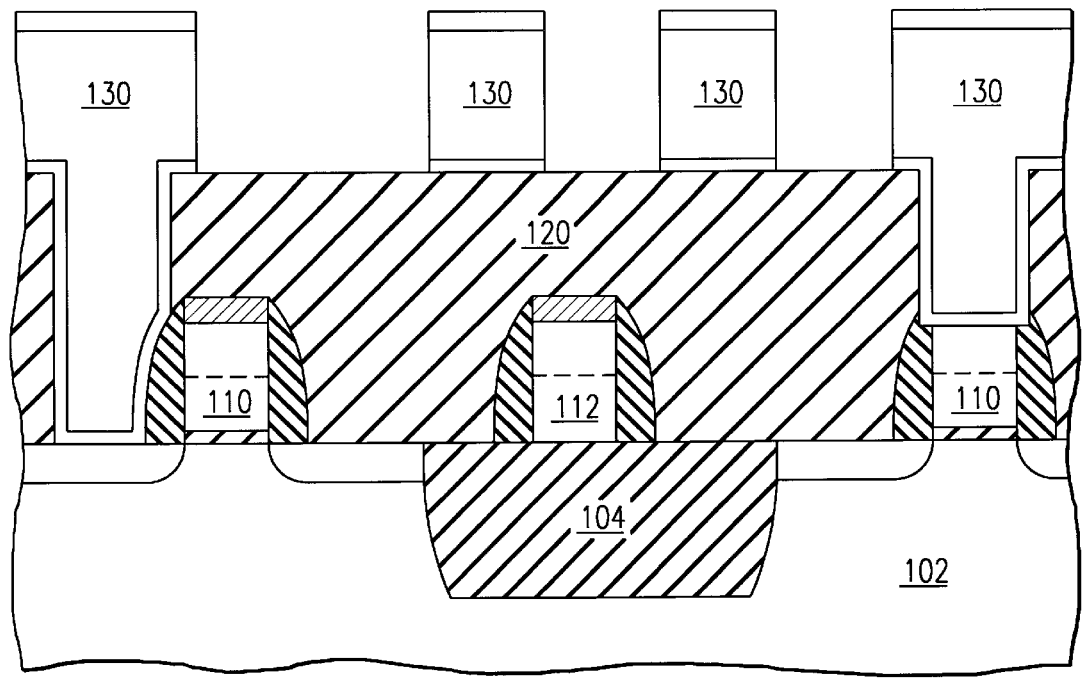
Figure 1D:
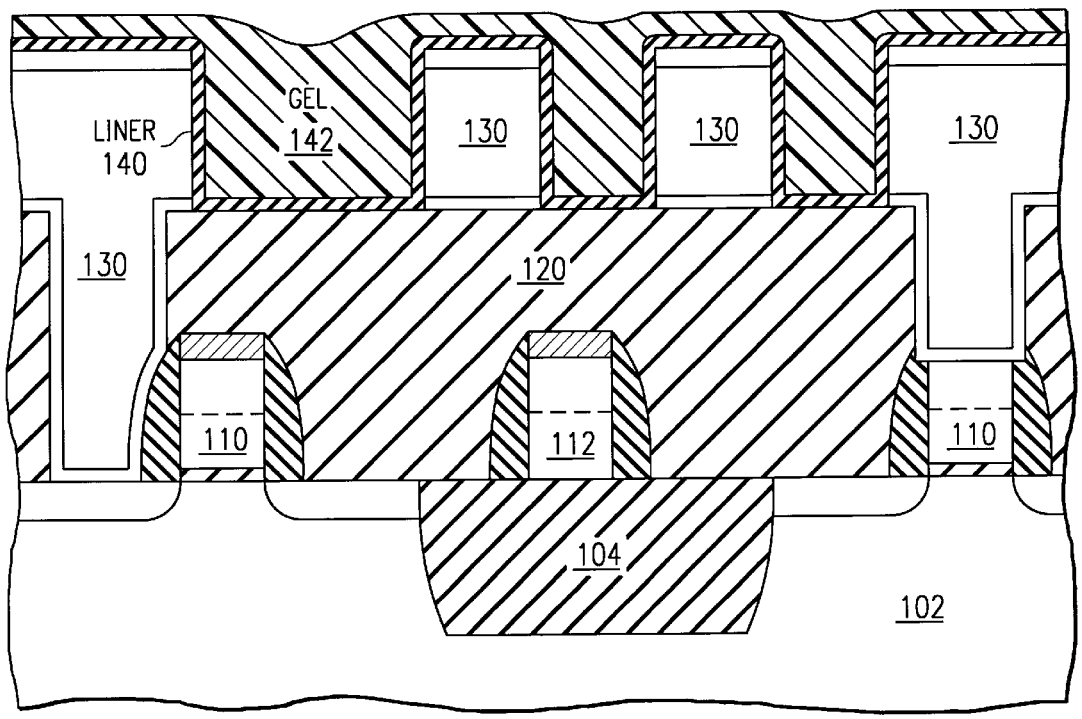

(5) Photolithographically define and etch the first level metal to form first level interconnects 130; see FIG. 1c. The gaps between adjacent interconnects 130 may be on the order of 200–300 nm, and these minimal gaps dominate the capacitive couplings.

(6) Deposit a 50 nm thick conformal oxide liner 140 on interconnects 130 plus exposed dielectric 120 by plasma-enhanced decomposition of TEOS with oxygen or ozone. Liner 140 passivates the metal surfaces and prevents diffusion of metal along the pores of the subsequent deposited xerogel. It also provides mechanical strength to suppress electromigration and suppress interconnect-to-interconnect leakage current. Other dielectric liner materials may be used, but the liner material contributes to the effective dielectric constant between the minimal gaps. Thus high dielectric constant liner material must be very thin.

(7) Spin coat liner 140 with a solution of xerogel precursor (e.g., oligomers condensed from hydrolyzed TEOS monomers in an ethanol plus ethylene glycol or other polynol solvent) with added NH4OH catalyst. The viscosity of the coating solution determines the planarity of the resulting xerogel as described in the viscosity section below.

The spun on coating 142 may be thick enough to cover the tops of the interconnects 130 by roughly 100 nm, fill the minimal gaps, and be roughly 300 nm thick in open areas between interconnects. About 3 ml of precursor on an 8 inch wafer suffices; see FIG. 1d.

(8) Age the coated precursor solution at room temperature in an NH4OH atmosphere for 1–20 minutes. Alternatively, decrease the reaction time by heating to 120° C. for 1–4 minutes. During this aging the condensation reaction yields a porous polymer network with solvent plus water (condensation reaction product) in the pores; that is, a gel. The ethanol will rapidly evaporate but the ethylene glycol has lower vapor pressure along with a high surface tension.

(9) Replace the solvent in the polymer network pores (primarily ethylene glycol) with ethanol or some other low surface tension liquid by continuous spin coating with ethanol. Without this replacement the high surface tension of the original solvent may (partially) collapse the polymer network during solvent evaporation due to surface tension within the drying pores. However, if the polymer network is strong enough to withstand the surface tension, then this step could be omitted.

(10) Spin a source of hydrophobic groups, such as hexamethyldisilizane (HMDS), onto the gel to convert any remaining hydroxyl groups on the polymer network to hydrophobic groups, such as trimethylsilyl groups. The reaction could be of the type:

≡SiOH+(CH3)3Si—NH—Si(CH3)3→≡Si—O—Si(CH3)3+NH3

Typically, the overall hydrolysis plus condensation reaction converts roughly 70% of the ethoxysilicon bonds of the TEOS to siloxane bonds and the remaining 30% of the ethoxysilicon bonds mostly into silanol bonds. The hydrophobic group substitution eliminates most of these silanol bonds. The silanol groups are hydrophilic and induce higher dielectric constants and cause potential metal corrosion problems. However, if hydrolysis plus condensation produces only a small number of hydroxyl groups, then this step could be omitted.

(11) Rinse the wafer with a low surface-tension liquid such as hexane. If the polymer network of the gel is strong enough, then this solvent exchange may be omitted. Evaporate the majority of the hexane by heating the wafer to 300–350° C. for about 60 seconds to dry the gel and thereby form a xerogel which consists of the polymer network with vaporsir in the pores. The xerogel may be 50–90% pores and 10–50% polymer network by volume with the pores having an average diameter on the order of 10–20 nm.

(12) Further dry the hydrophobic xerogel in a reducing atmosphere of forming gas (95% N2+5% H2) at 425° C. for 30 minutes. The drying drives residual liquid out of the xerogel pores. The Drying section below describes alternative drying environments.

Note that the xerogel in the gaps between interconnects is constrained by the surrounding surfaces and cannot shrink (without pulling loose from a surface), whereas the overlying xerogel may shrink down without constraint. Thus the relative pore volume in the gaps may be higher than the relative pore volume above the interconnects, and thus the dielectric constant may be lower in the gaps than above the interconnects.

Figure 1E:
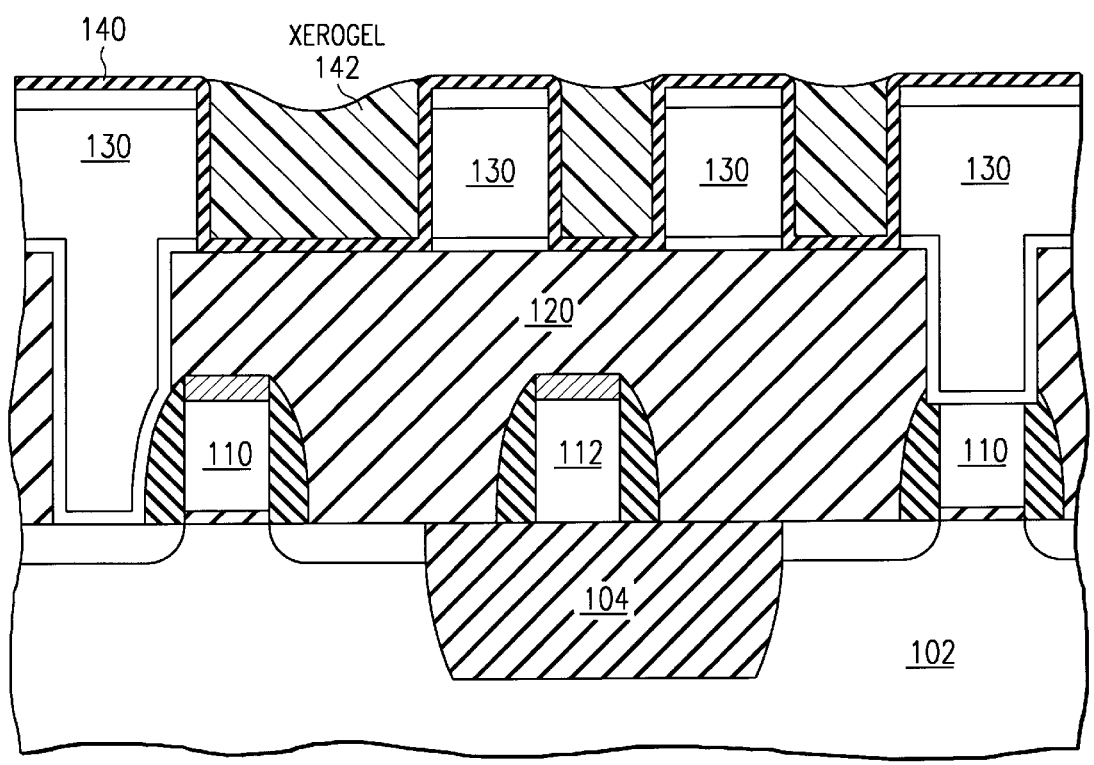
Figure 1F:
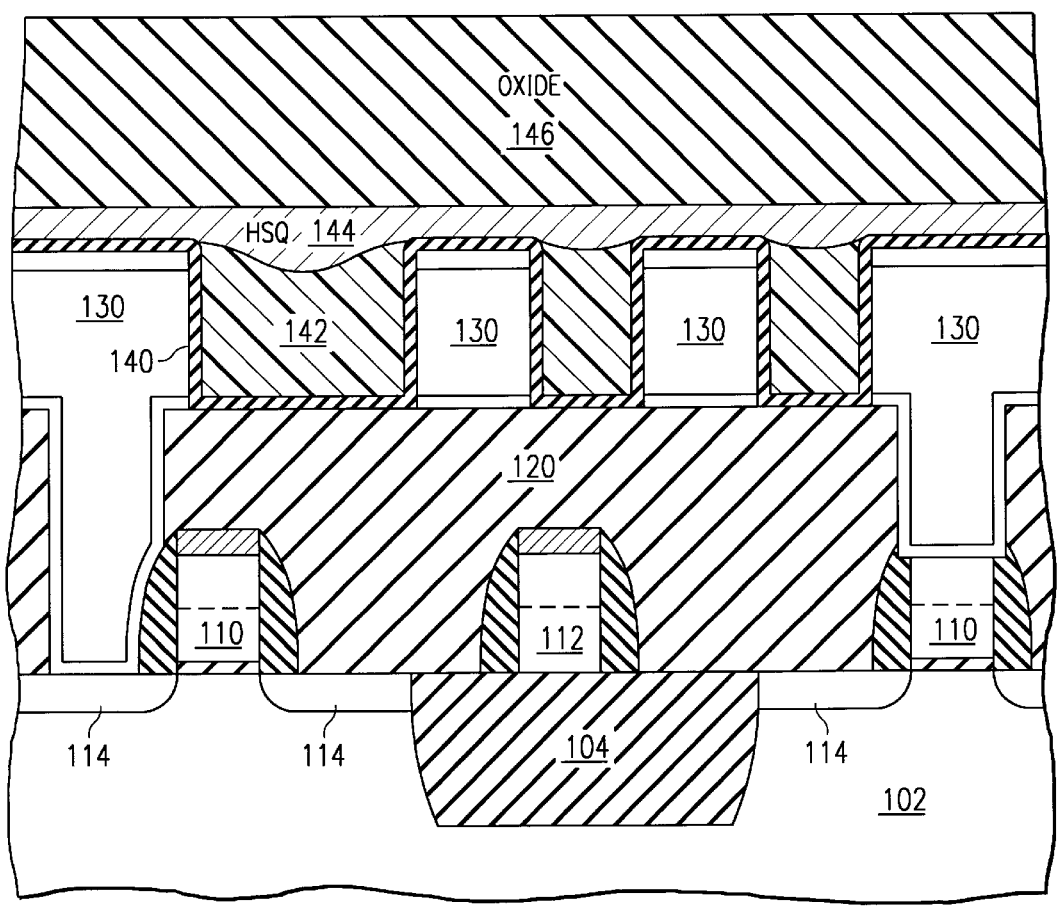
Figure 1G:
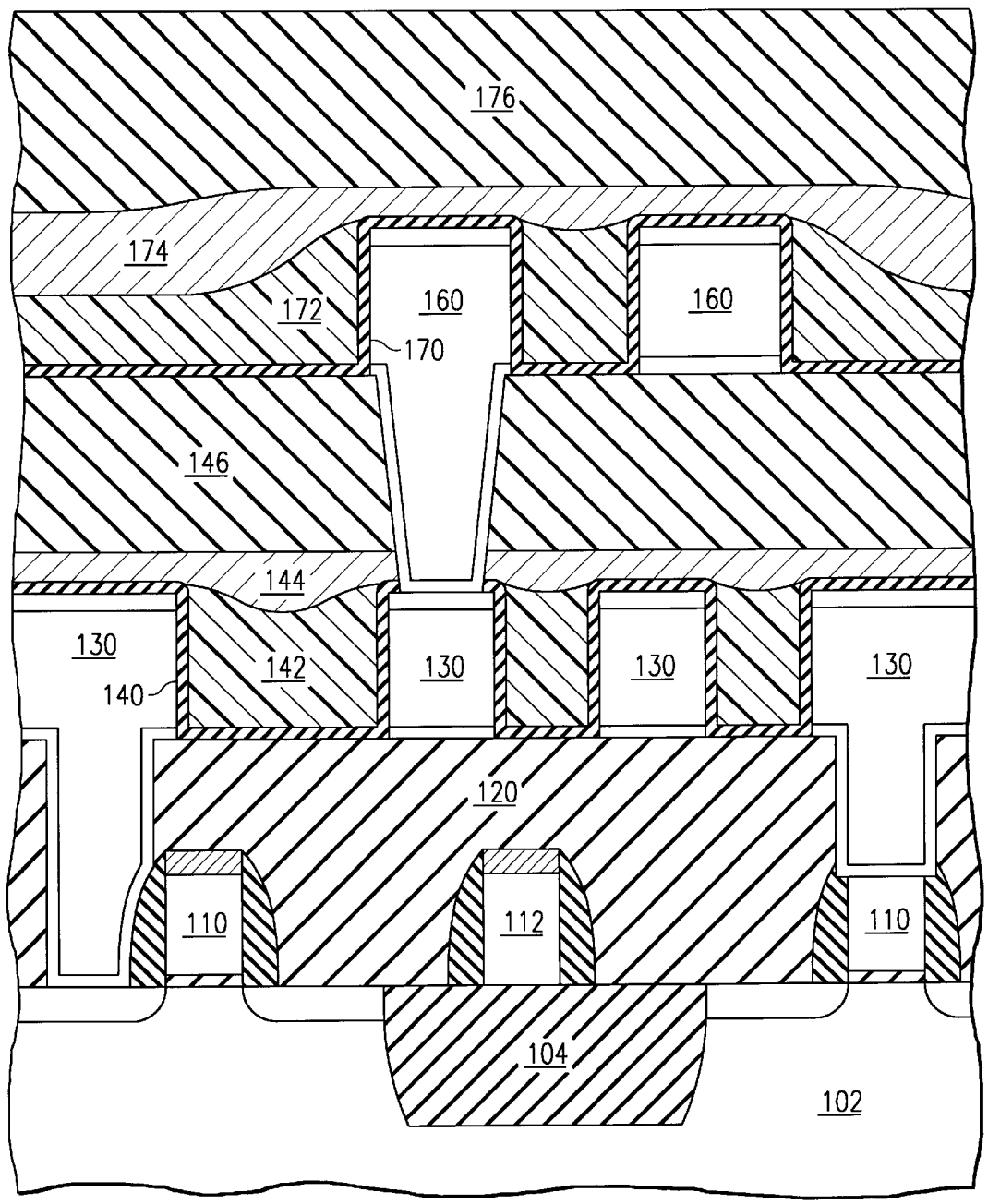

(13) Etchback the xerogel 142 about 100 nm to expose the liner on the tops of the interconnects 130; see FIG. 1e. The etchback may be by a fluorine-based plasma. This etchback to clear the xerogel from the tops of the interconnects 130 has the advantage that vias in the next level of interconnects will not have to be etched through xerogel, so lateral etching control may be simple and outgassing from the xerogel into etched vias will not be a problem.

(14) Spin on 200–300 nm average thickness layer 144 of hydrogen silsesquioxane (HSQ) and cure it at 400° C. HSQ layer 144 adheres to underlying xerogel 142 (probably by filling open pores at the surface) and provides a good surface for subsequent deposition of a thick capping dielectric; see FIG. 1e. Without HSQ adhesion layer 144, the hydrophobic surface of xerogel 142 would provide poor adhesion for oxide deposited by plasma-enhanced TEOS decomposition. The Adhesion sections below describes further xerogel surface adhesion enhancement preferred embodiments.

(15) Deposit a 1500 nm thick dielectric 146 on the HSQ surface by plasma enhanced decomposition of TEOS with oxygen or ozone. Then planarize dielectric 146 with chemical mechanical polishing (CMP) to provide for an intermetal level dielectric thickness of about 1000 nm. This completes the first metal level interconnects; and further levels result from repetition steps (4)–(15) where the vias in the planarized dielectric extend down to immediately underlying interconnects. Note that a via may effectively extend through two or more levels by simply forming a vertical stack of vias and overlying small metal patches.

Gapfill without Etchback

Figure 2A:
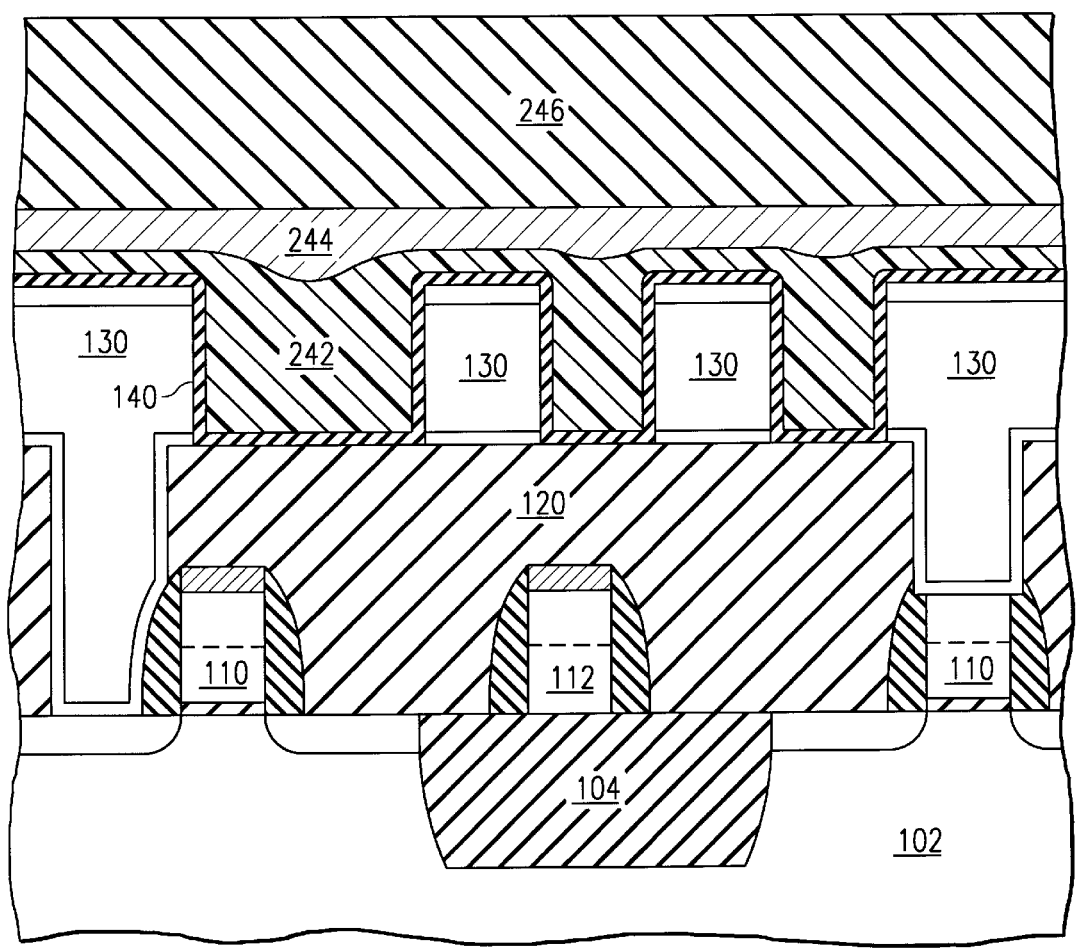
FIGS. 2a–b illustrate in cross sectional elevation views another preferred embodiment.

The preceding preferred embodiment etched back the xerogel in step (13) to expose the liner on top of the interconnects. In contrast, the nonetchback preferred embodiment omits this etchback step and spins on the adhesion layer (e.g., HSQ) immediately after completion of the xerogel drying. Thus follow preceding steps (1)–(12), corresponding to FIGS. 1a–d, skip step (13), and continue with step (14). See FIG. 2a showing 100-nm-average-thickness adhesion layer 244 on as-deposited xerogel 242 with 700 nm thick planarized dielectric layer 246 on the adhesion layer.

As in preceding preferred embodiment step (15), next define and etch vias through dielectric 246, adhesion layer 244, xerogel 242, and liner 140 down to interconnects 130. Note that the via etch only goes through about 100 nm of xerogel 242. Experimentally, the exposed xerogel appears not to contaminate the via bottom, and TiN or Ti/TIN barrier of interconnect 260 makes a good interface with xerogel 242.

Figure 2B:
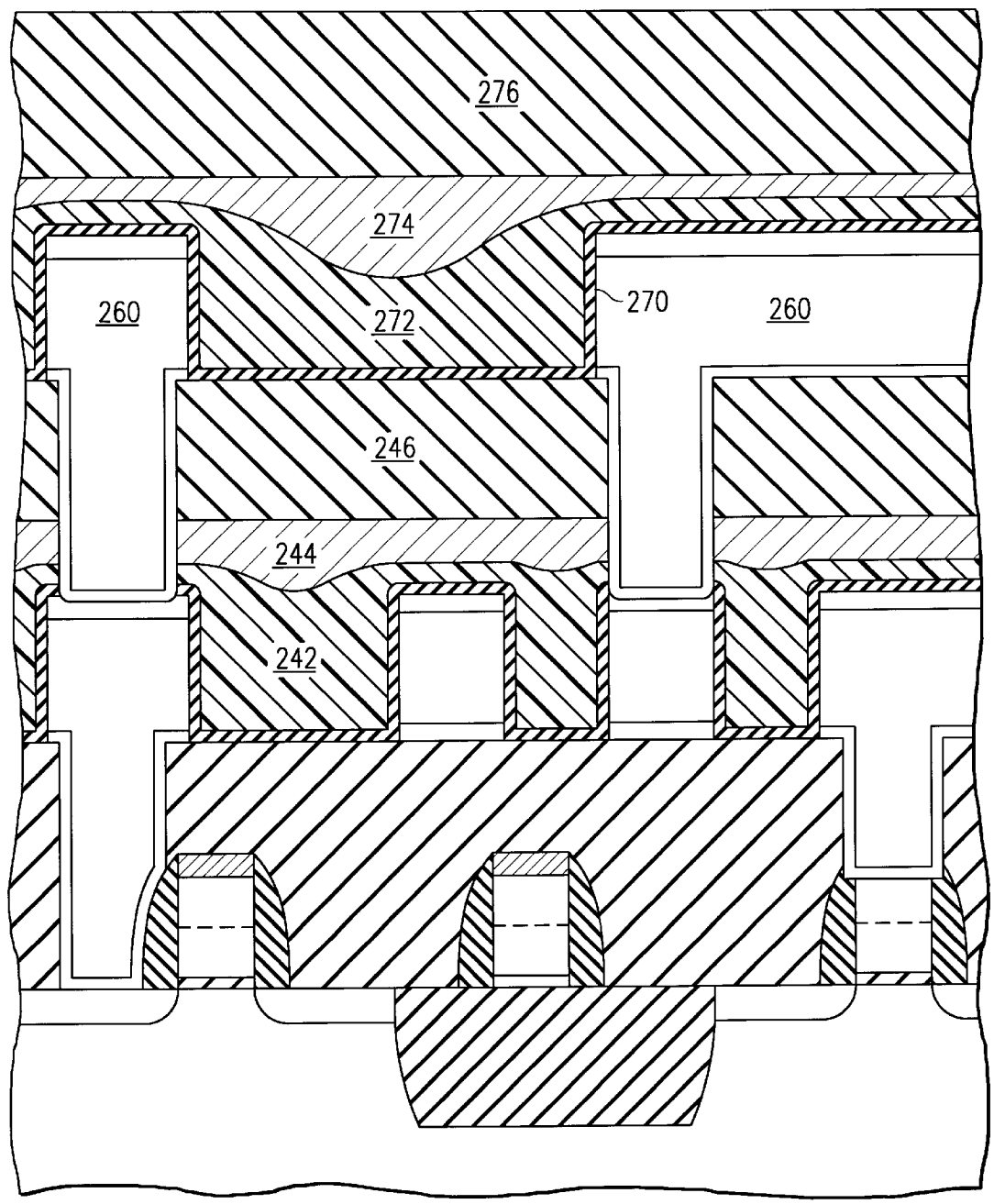

Of course, most of the via sidewall is oxide 246, so even poor adhesion to xerogel 242 by the barrier layer does not present a problem. Interconnects 260 are patterned, liner 270 deposited, second level xerogel 272 formed, HSQ adhesion layer 274 spun on, and capping oxide 276 deposited in the same manner as the corresponding components of the gapfill with etchback preferred embodiment previously described; see FIG. 2b.

Damascene Preferred Embodiment

Figure 3A:
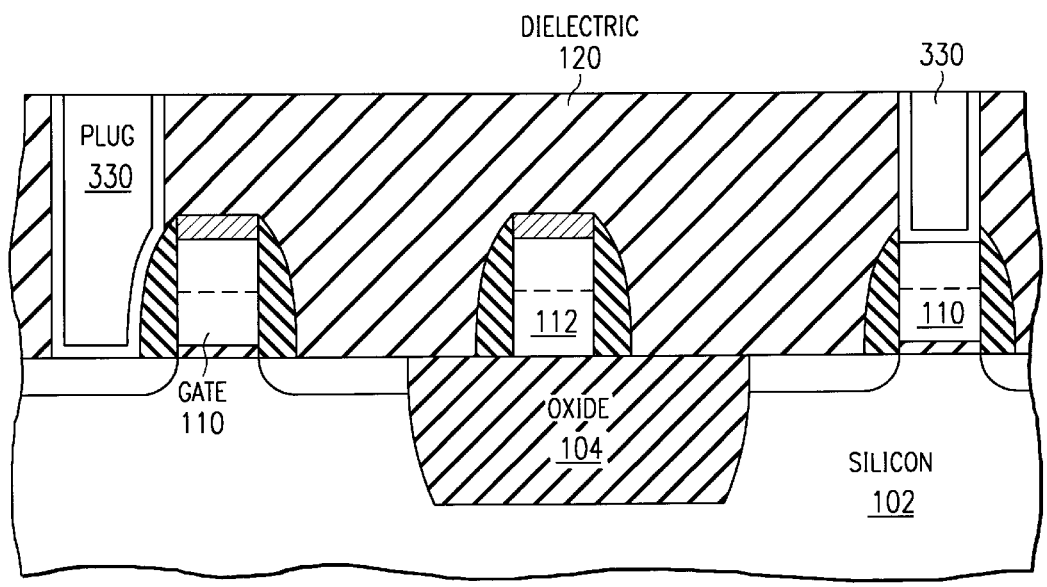
FIGS. 3a–f show in cross sectional elevation views a further preferred embodiment.

A further preferred embodiment uses xerogel dielectric in a damascene approach as illustrated in FIGS. 3a–f. In particular, begin with steps (1)–(4) of the gapfill preferred embodiments (FIGS. 1a–b), and in place of step (5) (patterning the blanket metal to form the first level interconnects) etchback the blanket metal to leave metal only in the vias; see FIG. 3a showing metal plugs 330 in the vias. The metal etchback may be, for example, by (isotropic) plasma etch (endpoint by loading drop) or by CMP. Alternatively, fill the vias by the same approach using doped polysilicon rather than metal: a blanket deposition of in situ doped polysilicon which fills the vias followed by an etchback to remove the polysilicon outside of the vias.

After via fill, spin on xerogel precursor solution (plus catalyst if necessary) and process as in preceding gapfill preferred embodiment steps (7)–(12) to form 700 nm thick xerogel layer 342.

Figure 3B:
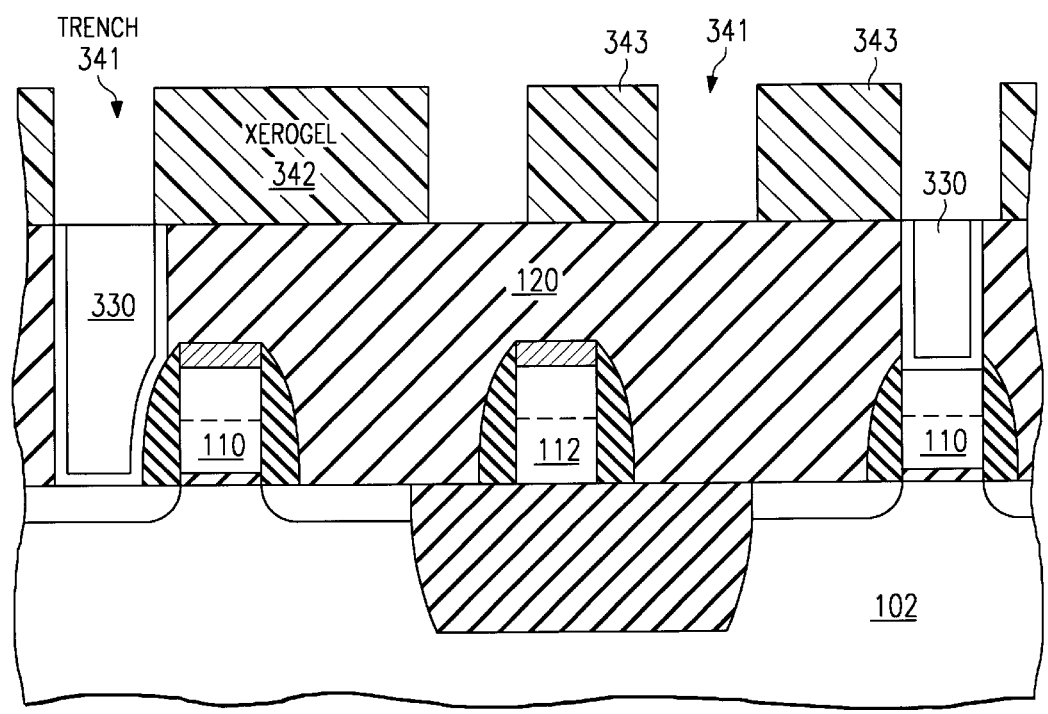

Next, photolithographically define the locations of interconnects and etch trenches 341 in the xerogel down to dielectric 120 or plugs 330 at these locations; see FIG. 3b. The minimal spacing between adjacent trenches is about 200–300 nm, so the free-standing xerogel strips 343 have an aspect ratio of roughly 3 to 1. The etch may be an anisotropic fluorine-based plasma etch, such as CF4+CHF3+He+Ar. Because the xerogel has high porosity, it etches much faster than oxide, so an overetch will not remove much of underlying dielectric 120 even if dielectric 120 is oxide. Alternatively, dielectric 120 could have a nitride upper portion to provide a more selective etchstop for the xerogel trench etch. Blanket deposit 20–50 nm thick TiN conformal barrier layer 350 by PVD or CVD. Other barrier materials include TaN, Ta2N, W2N and TiSiN (which can be formed by silane treatment of amorphous TiN). The hydrophobic surface of xerogel 342 may not provide sufficient adhesion for the barrier layer, so activate the xerogel surface by removing the hydrophobic methyl groups in a hydrogen-containing plasma. The adhesion sections below describe surface activation embodiments. Also, CVD TiN provides better sidewall coverage than PVD, so use a CVD process such as ammonia plus tetrakisdimethylamino titanium (TDMAT).

Deposit (e.g., electroplate, CVD, PVD) 200 nm thick copper layer 352 on the TiN; this fills the interconnect trenches etched in the xerogel 342 in the previous step plus covers the remainder of the wafer. See FIG. 3c.

Remove the portion of copper 352 outside of the interconnects by CMP; the CMP also planarizes any bumpiness in the plated copper. Alternatively, use a halogen plasma etch of copper, but these etches typically have fairly low etch rates because, for example, copper chloride tends to polymerize. CuCl can be removed with a strong Lewis acid such as triethylphosphine which reacts to form the gas ClCu (PEt3)2. Barrier layer 350 may also be a CMP polish stop; in this case the barrier must be etched off after the polishing. This CMP (or etching) leaves copper only as interconnect 352.

Figure 3C:
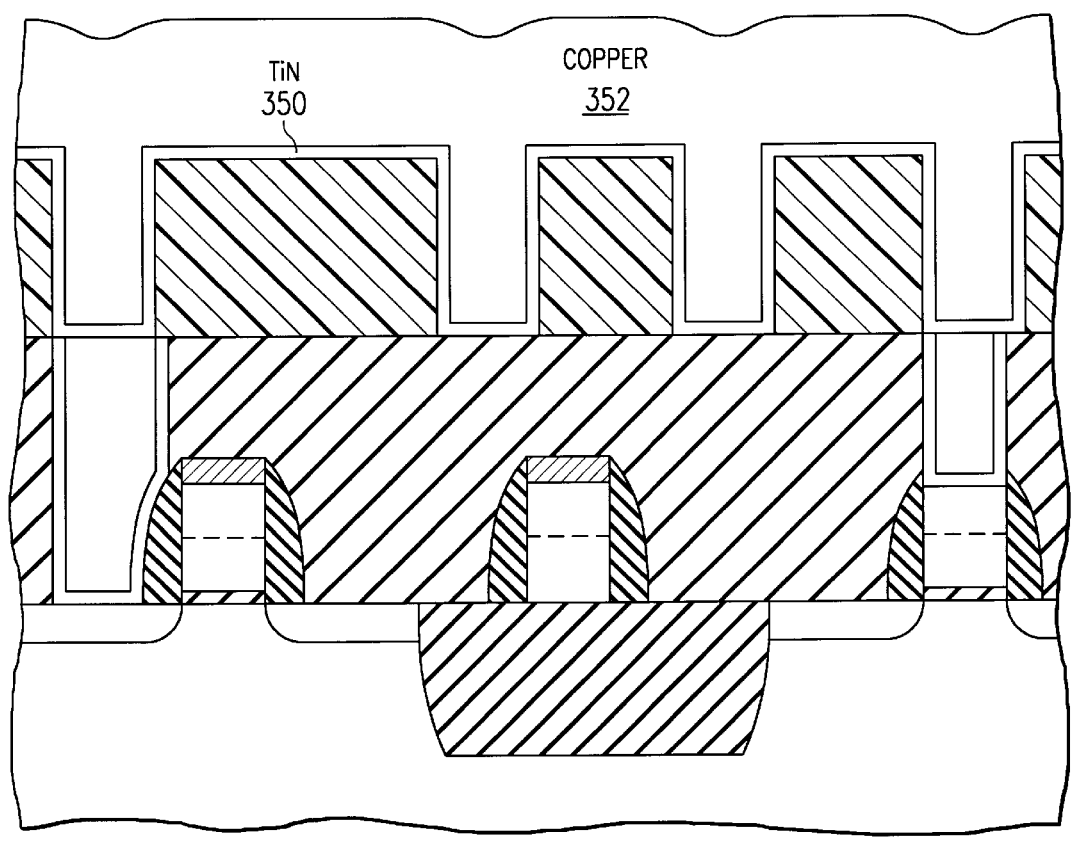
Figure 3D:
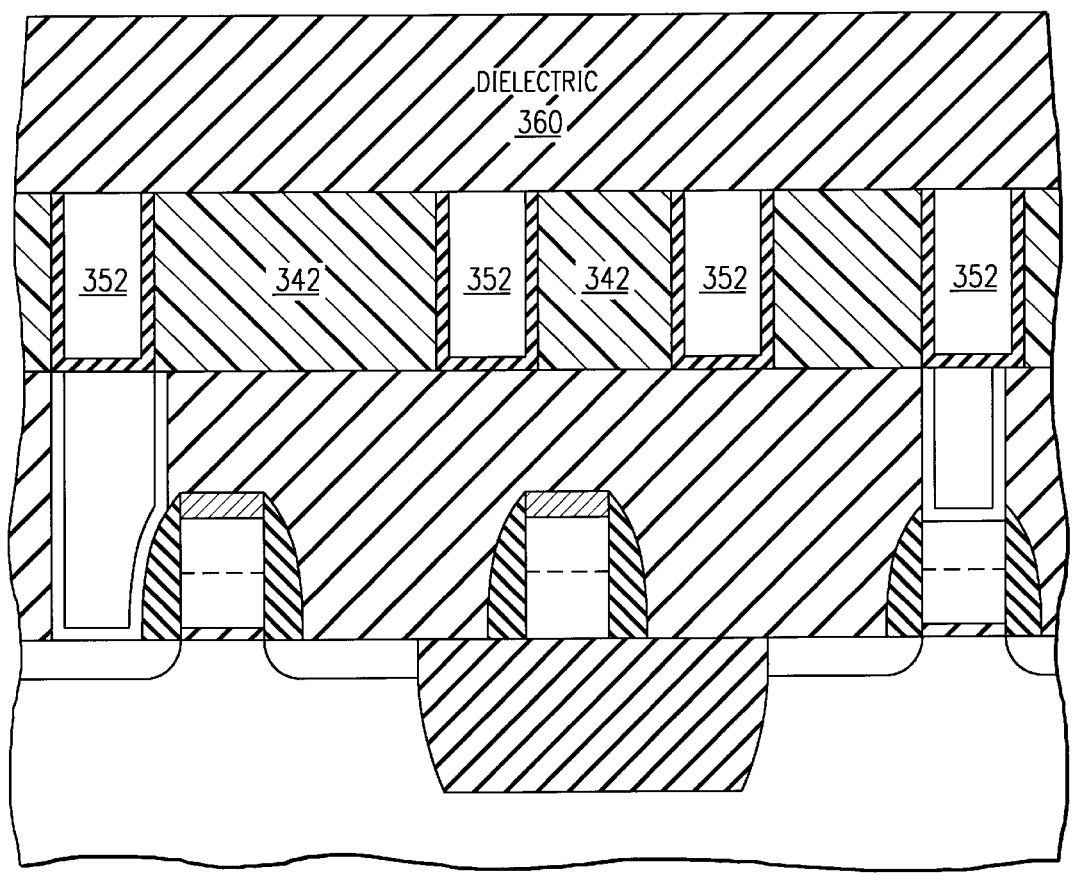
Figure 3E:
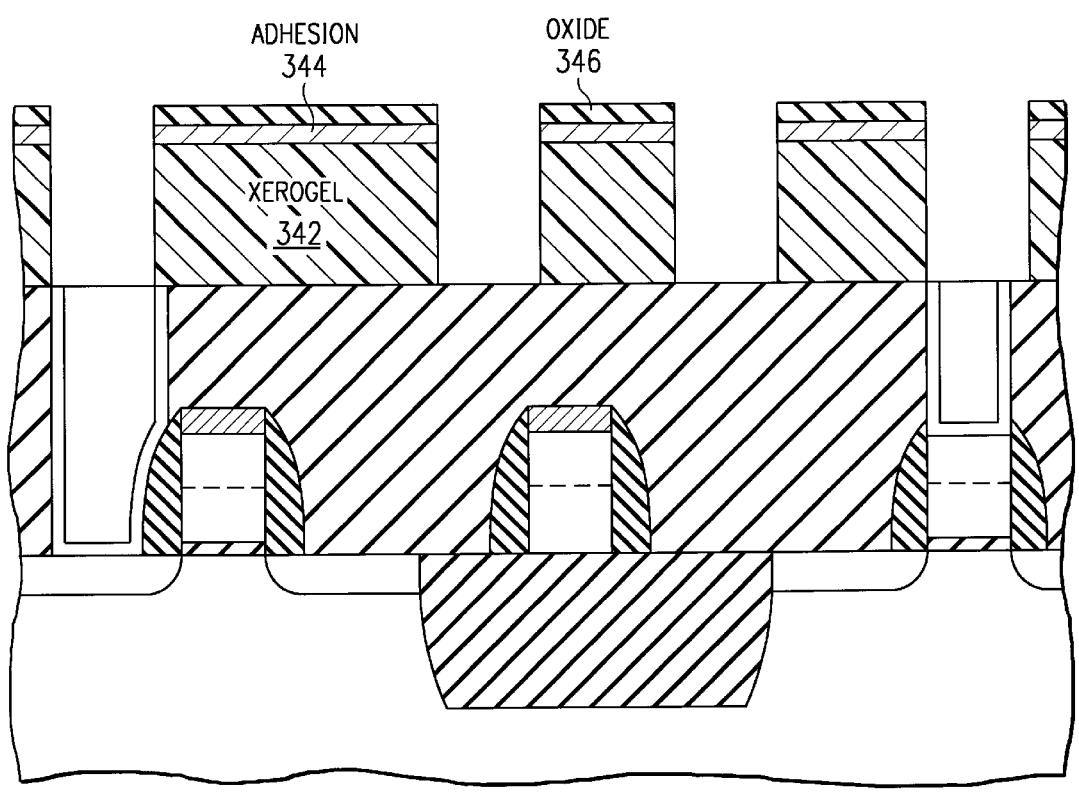
Figure 3F:
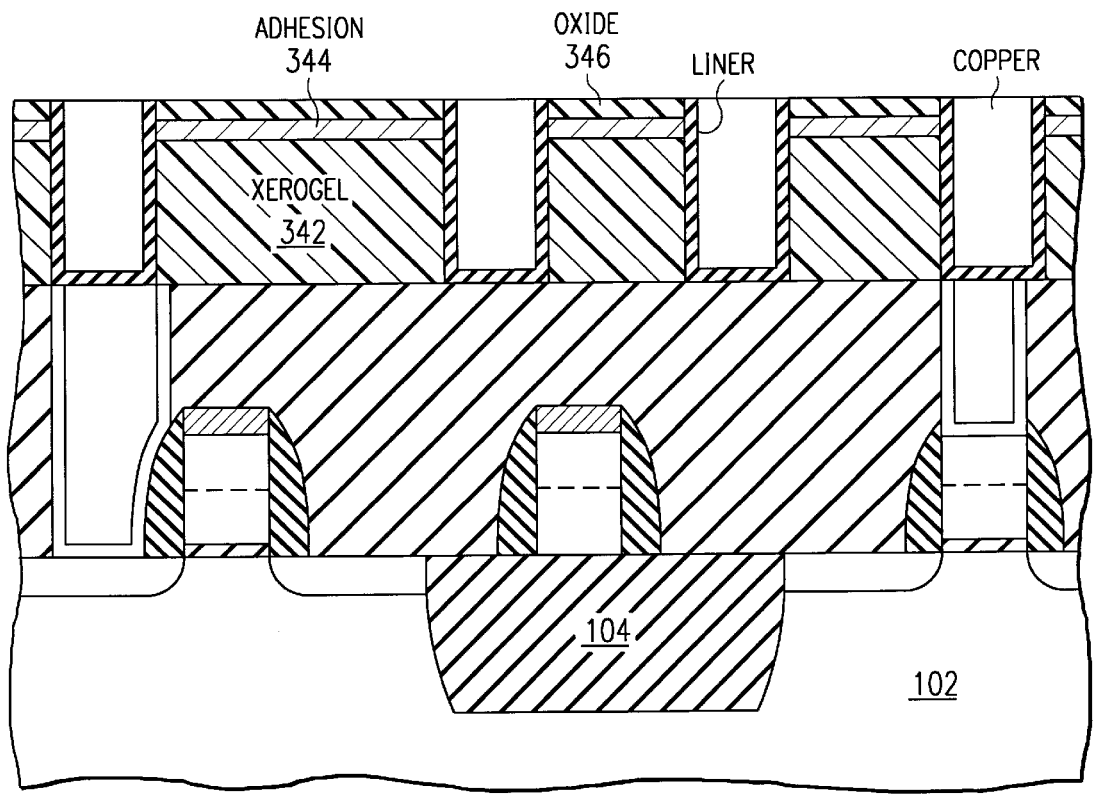

After the copper polishing, deposit 700 nm thick dielectric layer 360; see FIG. 3d. The dielectric may be oxide and deposited by plasma-enhanced TEOS decomposition with oxygen or ozone. This completes the first level interconnect (analogous to FIG. 1f), and repetition of the foregoing steps (via etch and fill, xerogel deposition, trench etch, trench fill, and dielectric deposition) provides further interconnect levels.

An alternative structure for more protection of the xerogel from CMP damage includes forming a 100 nm thick oxide layer 346 (on adhesion layer 344) on xerogel 342 surface prior to interconnect trench etch. In this case the trenches are etched through both the oxide (plus adhesion layer) and the xerogel; see FIG. 3e. Then follow the previously-described steps: barrier deposition, copper electroplating, and CMP to remove the copper outside of the interconnects. The CMP can remove a portion (or all) of the oxide plus adhesion layer, but the oxide (plus adhesion layer) protect the xerogel from exposure to the CMP; see FIG. 3f. Of course, a thick adhesion layer which also provides good CMP properties could be used in place of a thin adhesion layer plus deposited oxide.

Further levels of interconnects can be made by repeating the steps of etch vias in the dielectric on the xerogel plus top level interconnects, fill the vias, form xerogel layer, pattern interconnects in the xerogel, deposit blanket metal, polish to complete interconnects, and deposit overlying dielectric.

Slot Geometry Preferred Embodiment

Figure 4A:
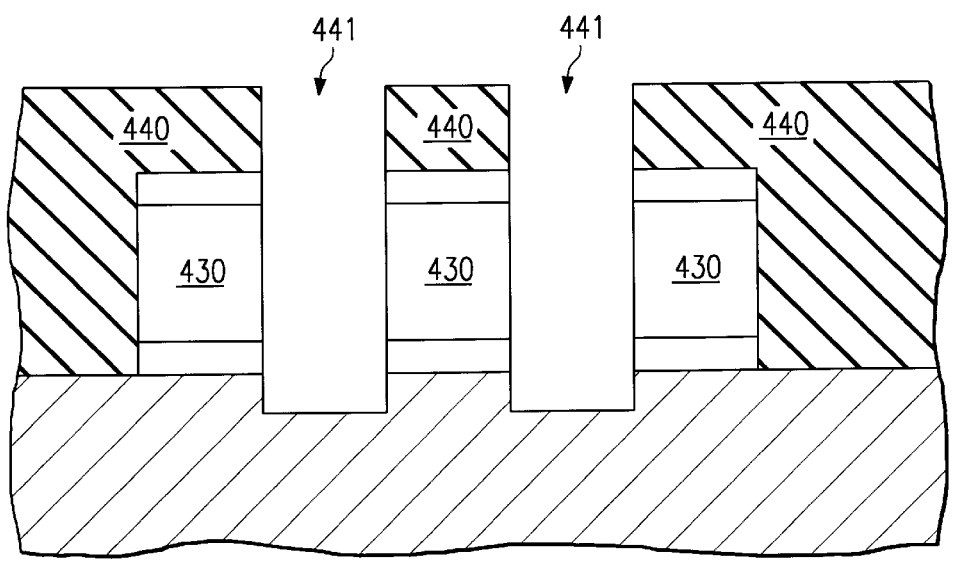
FIGS. 4a–c are cross sectional elevation views of another preferred embodiment.
Figure 4B:
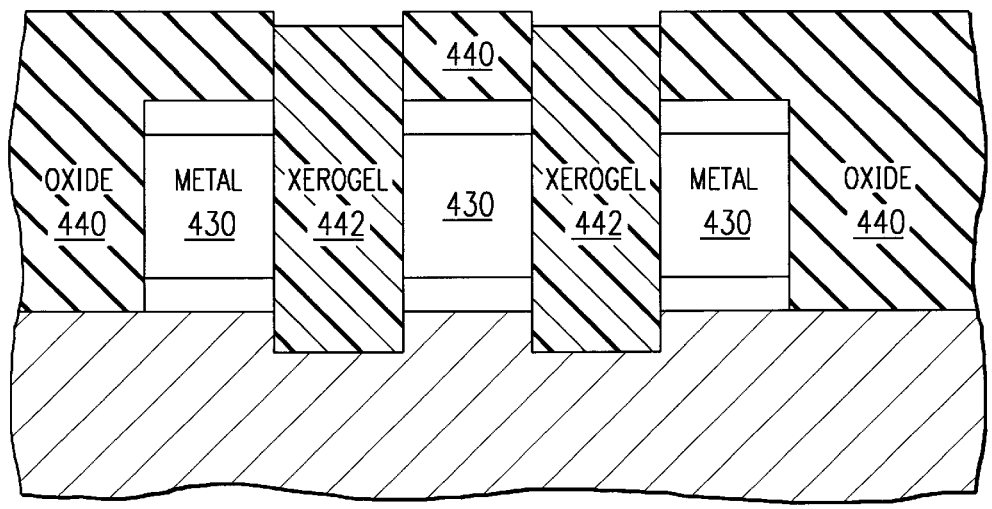
Figure 4C:
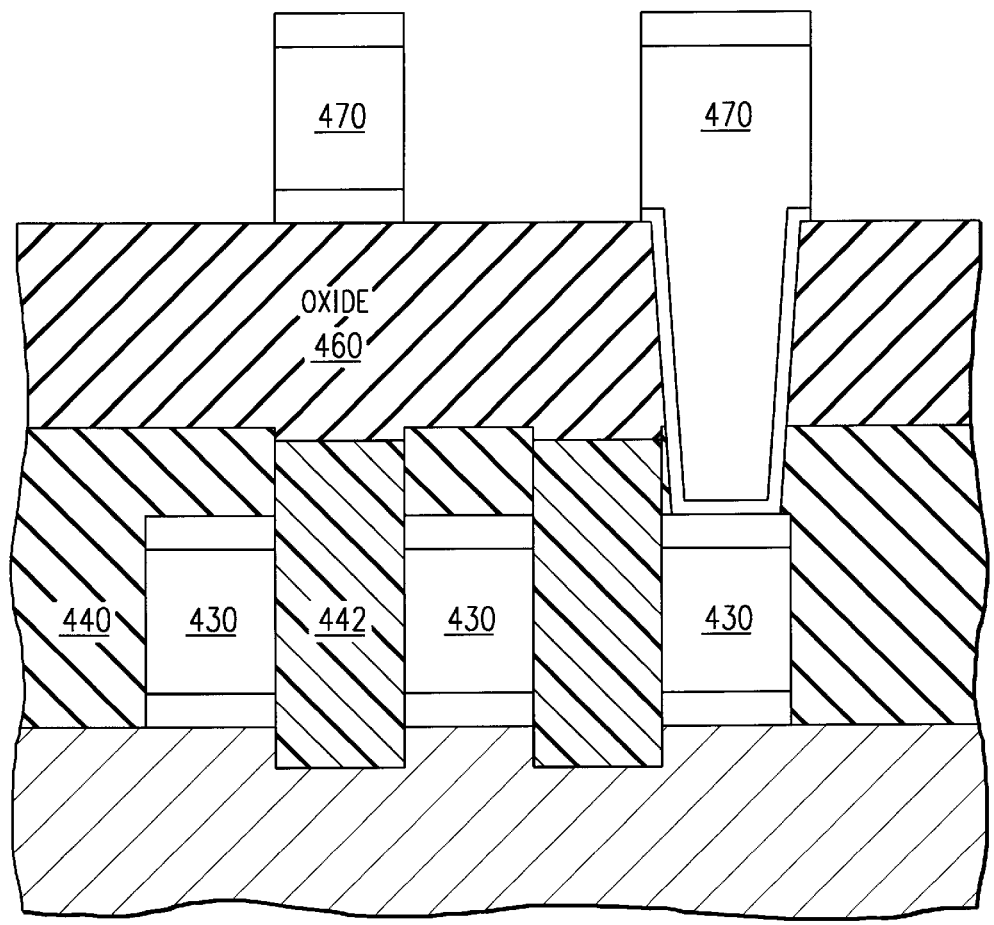

A further preferred embodiment deposits oxide over the interconnects, etches trenches between minimally spaced interconnects, and then fills the trenches with xerogel by a spin on and etchback. In particular, FIGS. 4a–c illustrate this approach. FIG. 4a shows trenches 441 which have been etched in planarized oxide 440 and between minimally spaced adjacent interconnects 430. Again, interconnects 430 may be 700 nm high and 200 nm wide with the minimal spacing of 200 nm.

Next, spin on a xerogel precursor solution which fills trenches 441 plus the horizontal portions of oxide 440, and then react to form the gel and dry to form xerogel 442. Etchback xerogel 442 (fluorine-based plasma) to remove all of the xerogel outside of the trenches; see FIG. 4b.

Deposit and planarize thick oxide 460 on oxide 440 and xerogel 442, the poor adhesion to xerogel 442 is not a problem because of the large oxide 440 area. Etch vias in oxide 460 down to interconnects 430, and deposit and pattern metal to form interconnects 470; see FIG. 4c. This approach only has xerogel in minimal gaps between adjacent interconnects; of course, this is where the xerogel has the most effect in lowering capacitive coupling.

Interconnects 430 could have a silicon nitride liner; this permits selective oxide etching the trenches in the minimal gaps between adjacent interconnects and leave the nitride liner to protect xerogel 442 from metal interconnects 430. However, such a liner will increase the effective dielectric constant between the adjacent interconnects.

Surface Filling Adhesion

Figure 5:
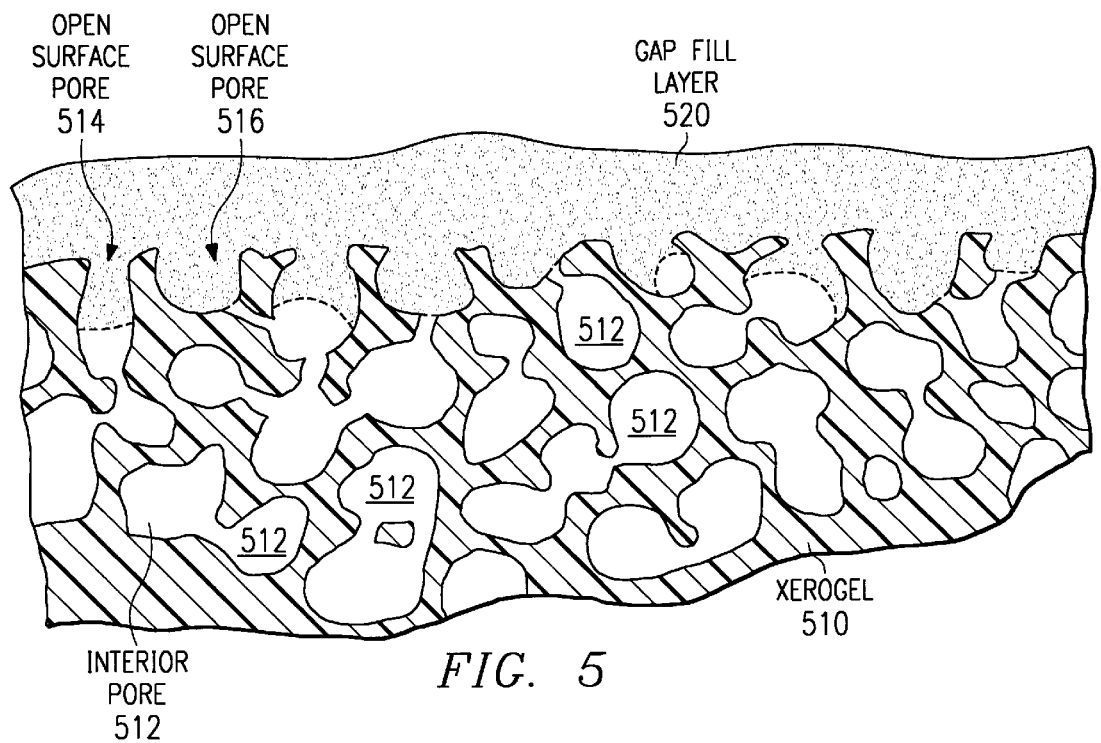
FIG. 5 shows open pore filling adhesion.

HSQ adhesion layer 144 of the preferred embodiments could be replaced by layers of other materials which also have good gap fill properties. In particular, the average pore size of xerogel varies with the dielectric constant, and for dielectric constants about 1.5 to 2.0 the average pore size is on the order of 10 to 25 nm. Thus a material which is depositable to fill open pores of this size at the surface will have a large contact area to bind to the xerogel plus will have mechanical interlocking to increase adhesion. FIG. 5 illustrates in cross sectional elevation view the open pore filling. FIG. 5 shows xerogel 510 including interior pores 512 away from the surface and pores 514–516 open at the surface; gapfill material layer 520 fills essentially all of pore 516 but only roughly half of pore 514. If the gapfill material fills roughly 50% or more of the volume of the average open pores at the surface, then the contact area increase and mechanical interlocking are significant. So a gapfilling material which provides a good surface for subsequent thick dielectric deposition may be used as an adhesion layer material.

For plasma enhanced TEOS oxide (or fluorinated oxide) thick dielectric, the following materials should sufficiently fill the open pores at the xerogel surface and provide the adhesion layer: HSQ, subatmospheric ozone TEOS based CVD (SACVD), methyl silsesquioxane, Flow Fill oxide (spin on silanol from silane in hydrogen peroxide at a temperature of 0° C.), and so forth.

Surface Activation Adhesion

Rather than apply a pore filling material such as HSQ 144 to xerogel 142 as in previous preferred embodiments to provide adhesion for deposited dielectric, an alternative preferred embodiment enhances the surface adhesion of xerogel by activating the xerogel surface with a plasma of 10–90% hydrogen and remainder argon for 1 minute with a pressure in the range of 0.1–5 Torr. The low energy plasma hydrogen removes the surface methyl groups of the hydrophobic xerogel with a net reaction such as:

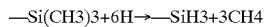
—Si(CH3)3+6H→—SiH3+3CH4

The hydrided silicon surface provides good adhesion to both deposited (fluorinated) oxides and other dielectrics such as organic polymers like parylenes.

Further, the hydrogen plasma treatment can be performed in the same chamber as the subsequent plasma-enhanced oxide deposition; so the hydrogen plasma adds little processing complexity.

The plasma activated xerogel surface also provides good adhesion for deposition of barriers such as TiN and Ta2N as used in the previously-described damascene interconnect structure.

Plasma surface treatment with plasmas based on other source gasses such as NH3, O2, . . . also activate the surface by reactions like:

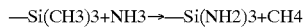
—Si(CH3)3+NH3→—Si(NH2)3+CH4

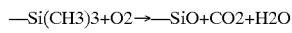
—Si(CH3)3+O2→—SiO+CO2+H2O

Surface Shell Adhesion

Figure 6:
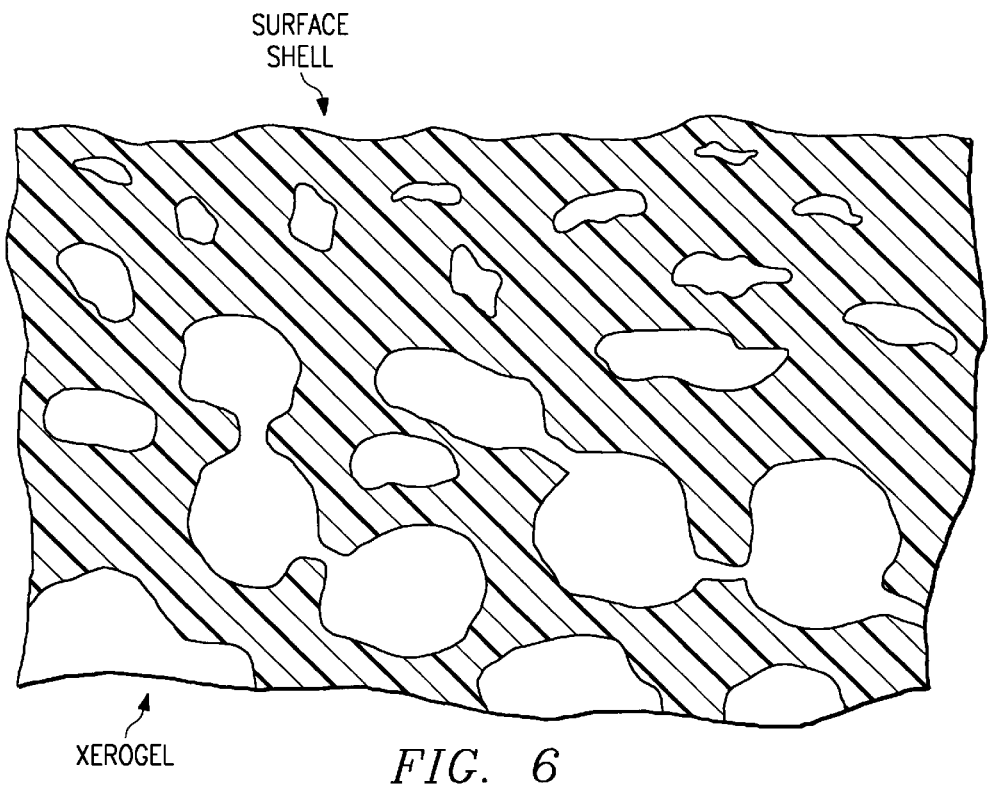
FIG. 6 illustrates hard shell.

An alternative xerogel surface enhancement collapses a thin layer of the xerogel at the surface to form a relatively continuous shell; the shell provides a large contact area for deposited layers. See FIG. 6 illustrating the continuous surface of the shell with collapsed pores near the surface. To form the shell, exposes the xerogel surface to ion beam bombardment. Typically, an ion implanter using an argon ion beam with a dose of $10^{16}/cm^2$ and an ion energy of 20 keV; alternatively, an argon plasma could provide the ion bombardment. The hard shell will be about 20–50 nm thick. The hard shell provides good surface adhesion for plasma-enhanced deposited oxide.

In effect, if the average pore diameter were D, then the portion of the xerogel within a distance of 2D of the surface would have a porosity (ratio of total pore volume to total volume) of much less than half of the porosity away from the surface.

Gel Drying

The drying of the gel in foregoing preferred embodiment step (12) could also be accomplished at other temperatures and with other reducing atmospheres at various pressures. The reducing atmosphere apparently helps remove residual absorbants which may be partially oxidized. This treatment brings the dielectric constant down to a stable minimum for the xerogel.

In particular, heating in the range of 400–500° C. for 1–60 minutes suffices for xerogel thicknesses up to 1 μm with the longer times for the lower temperatures. Typically, integrated circuit processes will have a thermal budget and an upper limit for temperature, and thus a lower temperature but longer drying may be required. However, drying with the same conditions as used for other heat treatments, such as 430° C. for 30 minutes aluminum sintering in forming gas, would be convenient.

The reducing atmosphere could be at a pressure of 1 mTorr to 10 Torr and the gasses could be H2 with an inert gas (N2, Ar, He, . . . ) in various proportions. Other reducing gasses such as CH4, NH3, . . . are possible.

Viscosity

Spin on dielectric solutions typically consist of two components: a dissolved solid and a solvent. During the spin on process, most of the solvent evaporates leaving a greater than 90% solids content film which is subsequently polymerized during hot plate or furnace bakes. The initial solids content must be relatively small (less than 30%) to insure film thickness uniformity across the wafer and good gapfill of high aspect ratio features. This low solids content generally implies low viscosity and poor planarization.

The preferred embodiment precursor solution as used in the preceding preferred embodiments can be thought to have three components: a high vapor pressure solvent (ethanol), a low vapor pressure solvent (a polynol such as ethylene glycol), and the TEOS oligomers; the volume percentages are roughly 70% high vapor pressure solvent, 20% low vapor pressure solvent, and 10% oligomers. This three component system permits two independent stages of the spin on process. First, just as in the case of typical spin on dielectrics, the three component system can be adjusted to have low enough viscosity to insure thickness uniformity and good gapfill. However, once the high vapor pressure ethanol has evaporated, the lower vapor pressure polynol with dissolved oligomers is still a liquid just beginning to crosslink (polymerize). This viscous liquid has already achieved good wafer thickness uniformity and gapfill and can be spun at higher speeds to achieve better planarization. For example, the initial spin on may be at 1000 rpm and the second spin after ethanol evaporation may be at 5000 rpm. Note that the final xerogel film profile will be identical to the liquefied profile of the polynololigomer liquid after the final spin process because the sol-gel process forms a cross-linked network throughout the entire liquid volume. The two solvent sol-gel process thus enables an effective decoupling of film thickness uniformity and gapfill from planarization.

Figure 7A:
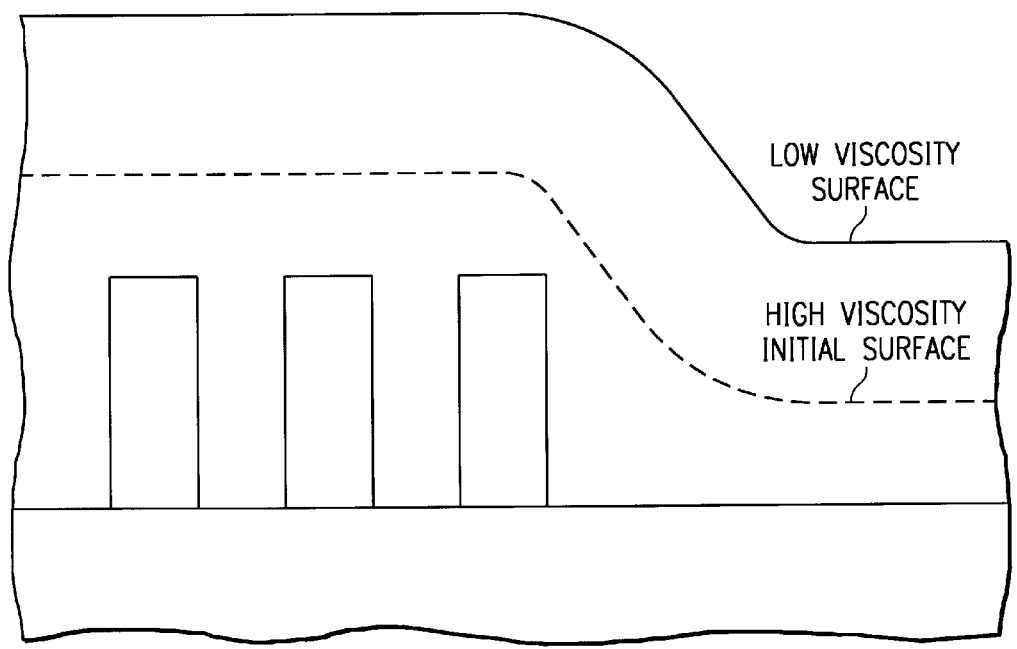
FIGS. 7a–b show in cross sectional elevation views of steps of a further preferred embodiment.
Figure 7B:
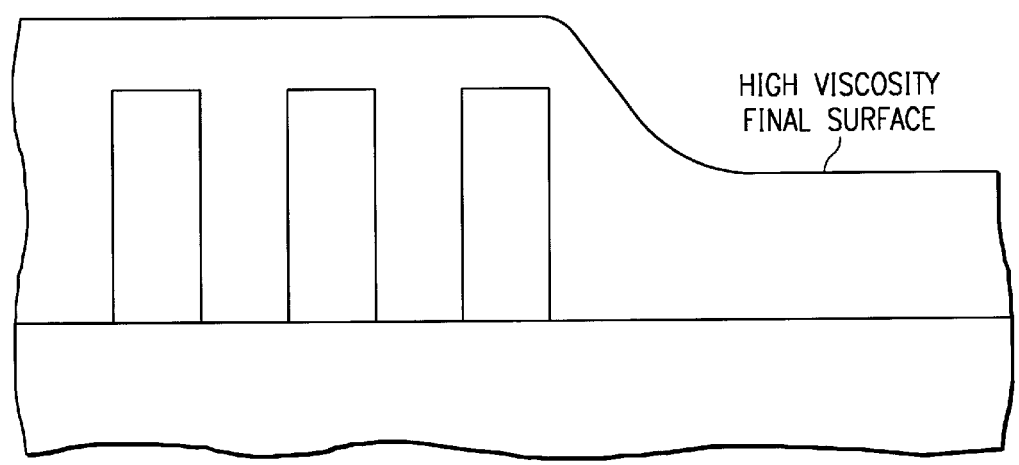

The viscosity of the polynol/oligomer liquid can be adjusted either by appropriate choice of the polynol or of the time allowed for the crosslinking to proceed before final high speed spinning. FIGS. 7a–b illustrates the two stage spin on: FIG. 7a shows the low viscosity three component system profile after spin on at low speed with the dotted line indicating the volume decrease when the high vapor pressure solvent evaporates; and FIG. 7b shows the subsequent profile after high speed spin for planarization with the viscous liquid.

Dummy Metal and Slotted Pads

The reduced mechanical strength of xerogel compared to dense oxides imposes two potential problems at either stress concentration regions or regions with large mechanical stresses. In particular, any variation in underlying metal topography over a length scale greater than that of a few times the minimum metal pitch will result in xerogel thickness variations and initiation points for cracking. In addition, in the highly stressed bondpad regions of the chip, it would be preferable to minimize the thickness of the xerogel atop the bondpad. The preferred embodiments solve both of these problems with a combination of dummy metal in the open areas and slotted bondpads. An additional advantage of this architecture is the nearly constant height of the xerogel top surface with respect to the silicon surface. This greatly increases the process margin of the CMP process.

Figure 8A:
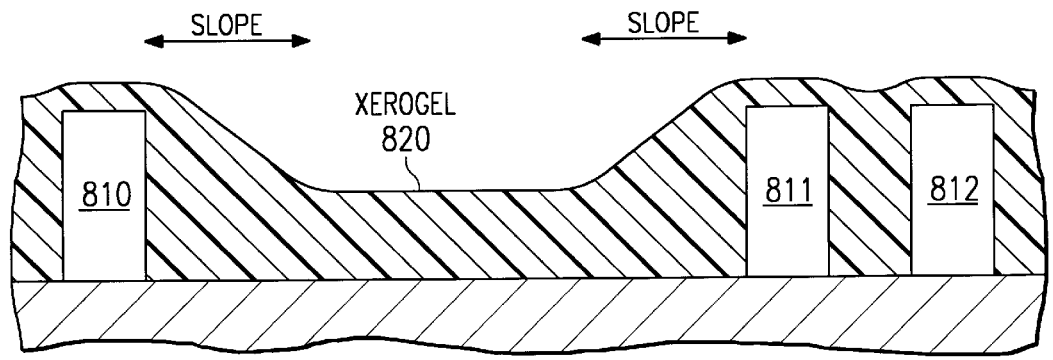
FIGS. 8a–e illustrate in cross sectional and plan views preferred embodiment layout structures.
Figure 8B:
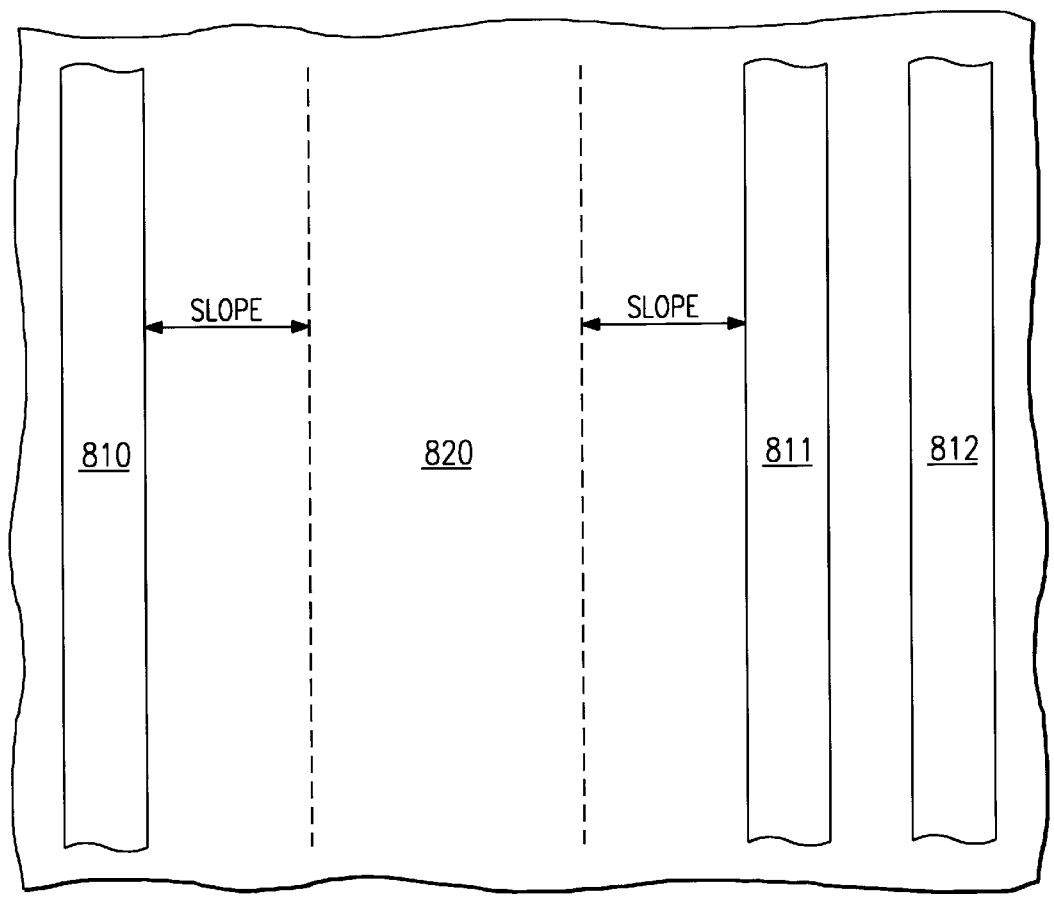
Figure 8C:
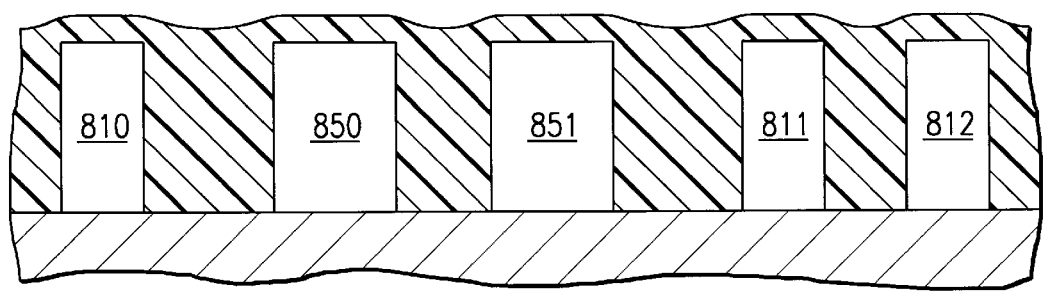
Figure 8D:
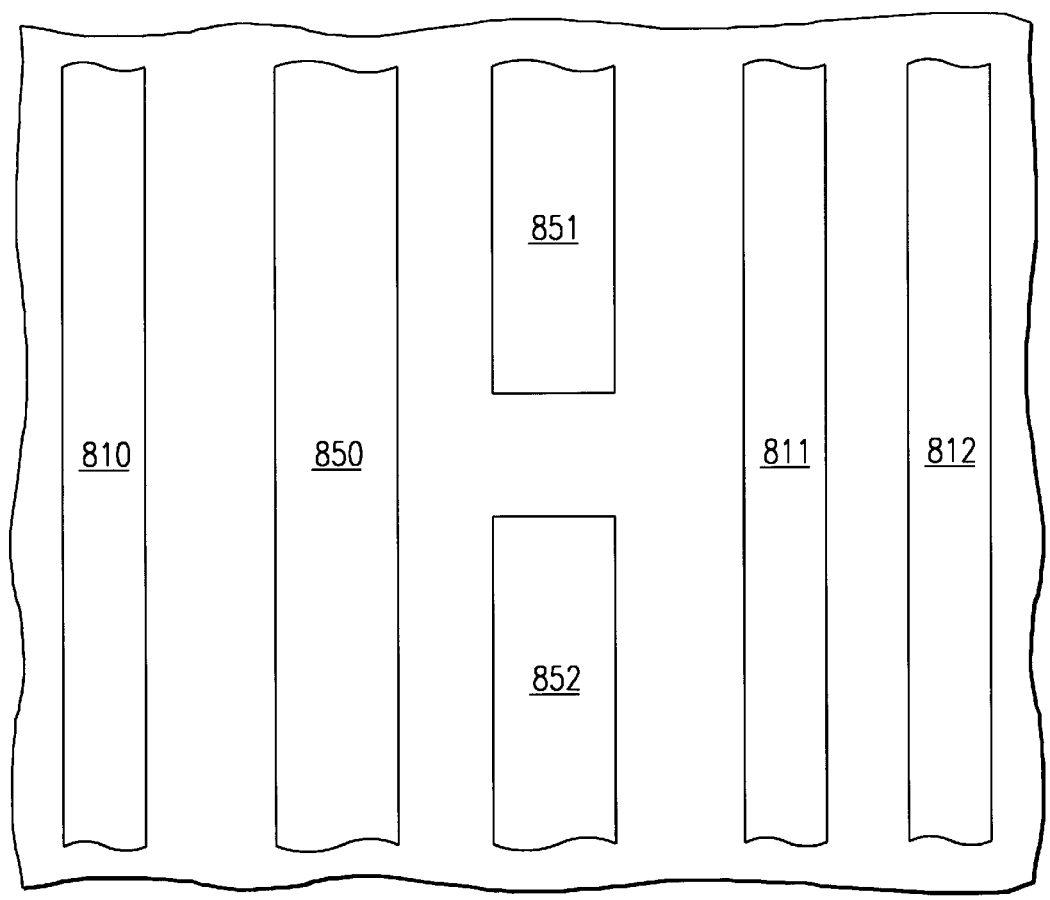

FIGS. 8a–b show in cross sectional elevation and plan view xerogel 820 on interconnects 810–812. The preferred embodiment interconnect structure adds electrically unconnected interconnects 850–852 to fill in open areas as between 810–811 and thereby planarize the xerogel as illustrated in FIGS. 8c–d. Indeed, interconnects 850–852 do not connect by vias to any other level interconnects and electrically float. Also, dummy interconnects need not be of the same width as electrically active interconnects and may be segmented as shown by 852–853. Indeed, arbitrary geometric patterns with not large open areas will suffice. The dummy interconnects may be more than the minimal gap from the closest active interconnect and still fill without significant surface sloping.

The planarized xerogel implies only a minimal amount of planarization need by used; in fact, using an HSQ adhesion layer will also sufficiently planarize to avoid CMP of the overlying deposited dielectric for the next level interconnects.

With damascene structure interconnects, dummy interconnects limit open areas of xerogel and add mechanical strength and thermal conductivity to the xerogel interconnect layer; recall FIGS. 3b–d. Further, the interconnects (electrically active plus dummy) can provide a polish stop for direct CMP without need for the oxide and adhesion layers as in FIGS. 3e–f. The dummy interconnects also provide vertical thermal conduits to avoid the limited thermal conductivity of the xerogel.

Figure 8E:
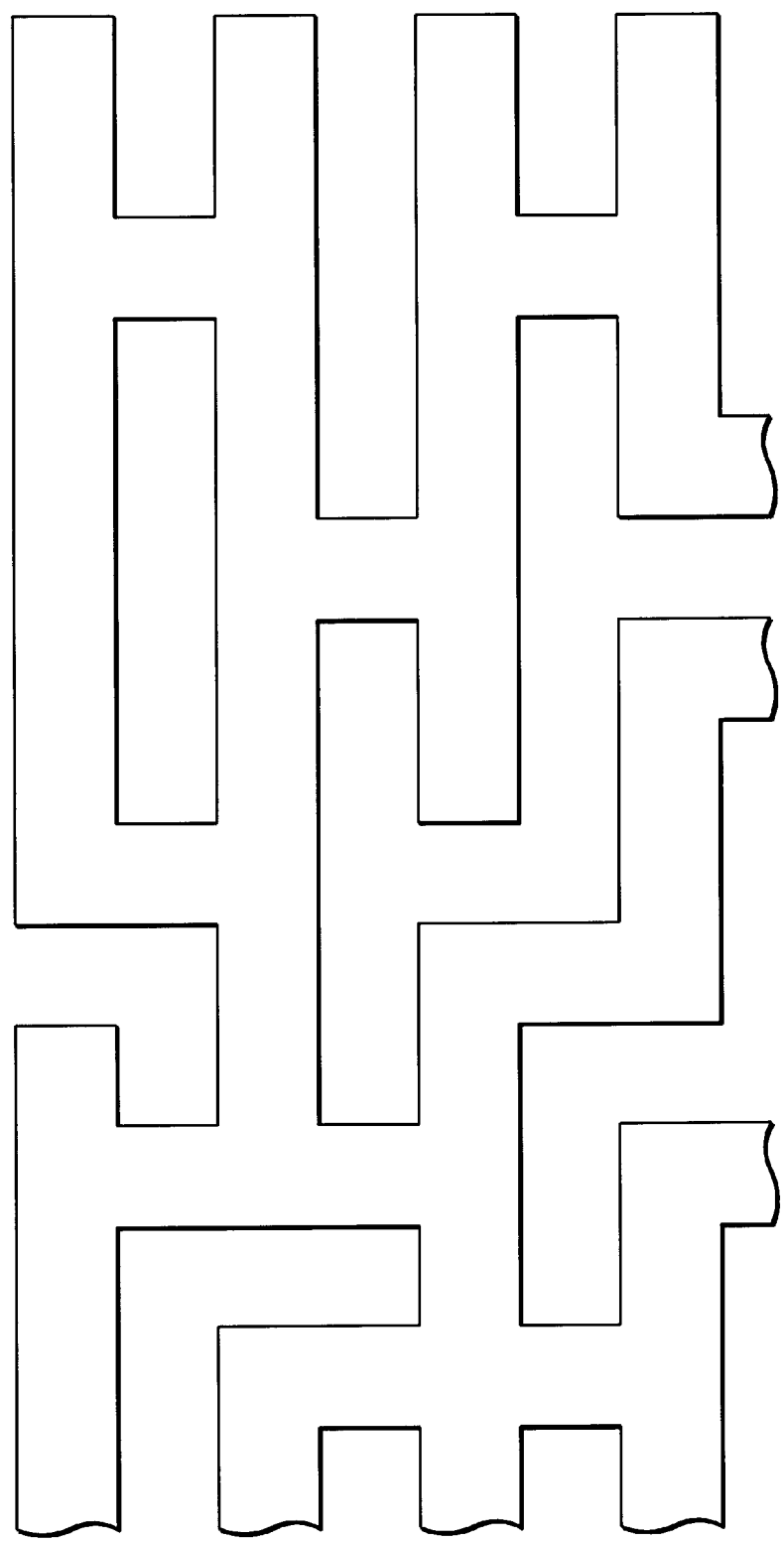

Laterally extended metal structures, such as bond pads, act like elevated open areas for the spin on xerogel and thus have a thicker top layer. To further planarize the spun on xerogel, preferred embodiment bond pads and other extended metal structures are formed as a series of interconnected interconnect segment as illustrated in FIG. 8e.

Thin Liner

The 50 nm oxide liner on the interconnects (see liner 140 in FIG. 1d) could be replaced by other dielectric materials to lower effective dielectric constant. In particular, any conformally depositable material which does not react with the interconnect metal and to which xerogel will stick could be used. For example, parylene can be conformally deposited from the vapor phase, and the subsequent xerogel will stick to parylene. Other materials include fluorinated parylenes (e.g., AF4), . . .

Modifications

The preferred embodiments can be modified in various ways while retaining the features of surface adhesion, reducing atmosphere drying, and dummy interconnects with three component system for two stage spin on.

For example, the xerogel may be a hybrid organic-silica (replace the original TEOS with monomers such as (EtO)$_3$Si—R—Si(OEt)$_3$ where R is a carbon linking group such as C6H4), the dimensions may be scaled.

What is claimed is:

1. A dielectric structure, comprising:

(a) a layer of porous dielectric with an average pore diameter of D and with porosity of p in the portion of said layer more than a distance 2D from a surface of said layer;

(b) wherein the portion of said layer within a distance of 2D of said surface of said layer has porosity of less than p/2; wherein:

(c) D is on the order of 10–20 nm.

2. A dielectric structure comprising:

(a) a layer of porous dielectric with an average pore diameter of D and with porosity of p in the portion of said layer more than a distance 2D from a surface of said layer;

(b) wherein the portion of said layer within a distance of 2D of said surface of said layer has porosity of less than p/2; wherein:

(c) said distance 2D is about 20–50nm.

* * * * *